United States Patent
Kuroda

(10) Patent No.: US 9,112,454 B2
(45) Date of Patent: Aug. 18, 2015

(54) SEMICONDUCTOR POWER AMPLIFIER

(71) Applicant: Kabushiki Kaisha Toshiba, Minato-ku (JP)

(72) Inventor: Kenta Kuroda, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/082,291

(22) Filed: Nov. 18, 2013

(65) Prior Publication Data
US 2014/0340160 A1    Nov. 20, 2014

(30) Foreign Application Priority Data
May 16, 2013    (JP) .................. 2013-104287

(51) Int. Cl.
| | | |
|---|---|---|
| *H03F 3/21* | (2006.01) | |
| *H03F 1/02* | (2006.01) | |
| *H03F 1/56* | (2006.01) | |
| *H03F 3/189* | (2006.01) | |
| *H03F 3/24* | (2006.01) | |
| *H03F 3/60* | (2006.01) | |

(52) U.S. Cl.
CPC ............ *H03F 3/211* (2013.01); *H03F 1/0288* (2013.01); *H03F 1/56* (2013.01); *H03F 3/189* (2013.01); *H03F 3/245* (2013.01); *H03F 3/602* (2013.01); *H03F 2200/192* (2013.01); *H03F 2200/198* (2013.01); *H03F 2200/204* (2013.01); *H03F 2200/387* (2013.01); *H03F 2200/541* (2013.01)

(58) Field of Classification Search
CPC .......... H03F 1/0288; H03F 1/07; H03F 1/325
USPC ................ 330/295, 124 R, 84, 126, 286, 310
See application file for complete search history.

(56) References Cited

U.S. PATENT DOCUMENTS

| | | | | |
|---|---|---|---|---|
| 5,606,283 | A * | 2/1997 | Allen et al. ................ | 330/124 R |
| 6,052,024 | A * | 4/2000 | Lo et al. .......................... | 330/53 |
| 7,486,136 | B2 * | 2/2009 | Bakalski et al. .......... | 330/124 R |
| 2006/0139092 | A1 | 6/2006 | Sundstrom et al. | |
| 2008/0136530 | A1 | 6/2008 | Salomon | |

(Continued)

FOREIGN PATENT DOCUMENTS

| | | |
|---|---|---|
| DE | 10 2006 052 611 A1 | 5/2008 |
| EP | 1 973 227 A2 | 9/2008 |

(Continued)

OTHER PUBLICATIONS

Extended European Search Report issued Feb. 14, 2014 in Patent Application No. 13191169.5.

(Continued)

*Primary Examiner* — Henry Choe
(74) *Attorney, Agent, or Firm* — Oblon, McClelland, Maier & Neustadt, L.L.P.

(57) ABSTRACT

A semiconductor power amplifier comprises an input-side amplifier for inputting and amplifying an input signal, a balanced amplifier which is connected to an output terminal of the input-side amplifier, comprises two hybrid couplers and a plurality of power amplifiers, passes the input signal, and converts a reflective wave into thermal energy, and an output-side amplifier which is connected to an output terminal of the balanced amplifier and amplifies an output signal.

1 Claim, 3 Drawing Sheets

(56) References Cited

U.S. PATENT DOCUMENTS

| | | |
|---|---|---|
| 2008/0231359 A1 | 9/2008 | Tanimoto |
| 2011/0006841 A1 | 1/2011 | Wyse et al. |
| 2014/0070883 A1* | 3/2014 | Gurvich et al. ........... 330/124 R |
| 2014/0340156 A1 | 11/2014 | Kuroda |
| 2014/0340160 A1 | 11/2014 | Kuroda |

FOREIGN PATENT DOCUMENTS

| | | |
|---|---|---|
| EP | 2 169 823 A1 | 3/2010 |
| JP | 5-48353 | 2/1993 |
| JP | 10-126299 A | 5/1998 |
| JP | 10-284958 A | 10/1998 |
| JP | 2014-225791 A | 12/2014 |
| JP | 2014-225792 A | 12/2014 |

OTHER PUBLICATIONS

Thomas Lehmann, et al., "Reconfigurable PA Networks using Switchable Directional Couplers as RF Switch" Proceedings of the 37th European Microwave Conference, XP031191986, Oct. 1, 2007, pp. 1054-1057.

Office Action issued Mar. 4, 2015 in Japanese Patent Application No. 2013-104287 (with partial English language translation).

* cited by examiner

SEMICONDUCTOR POWER AMPLIFIER

CROSS-REFERENCE TO RELATED APPLICATIONS

This application is based upon and claims the benefit of priority from the prior the Japanese Patent Application No. 2013-104287, filed on May 16, 2013, and the entire contents of which are incorporated herein by reference.

FIELD

The present invention relates to a semiconductor power amplifier.

BACKGROUND

There is used a semiconductor power amplifier using a compound semiconductor for a microwave or millimeter-wave power amplifier instead of a magnetron oscillator. However, the semiconductor power amplifier is not necessarily excellent in power gain of an individual semiconductor amplifier such as a transistor, and thus a plurality of semiconductor amplifiers are cascaded to obtain a desired power gain.

When a plurality of amplifiers are cascaded, however, stability in the power amplifier is deteriorated, for example, an oscillation easily occurs due to a state change in the amplifier caused by a reflective wave due to mismatch with a load to be connected.

Such a problem is conspicuous when a load impedance changes over time such as when an object is heated or processed by use of a microwave amplified by a semiconductor power amplifier, for example.

Thus, conventionally, a circulator or attenuator was provided between cascaded semiconductor amplifiers, thereby converting a reflective wave into thermal energy for absorption.

However, when an attenuator is inserted, power gain or power efficiency is deteriorated. A circulator has a small impact on power gain or power efficiency, but has a problem that it does not function under a ferromagnetic field.

DETAILED DESCRIPTION

A semiconductor power amplifier according to one embodiment will be described below in detail with reference to the drawings.

The semiconductor power amplifier according to the present embodiment comprises an input-side amplifier for inputting and amplifying an input signal, a balanced amplifier which is connected to an output terminal of the input-side amplifier, comprises two hybrid couplers and a plurality of power amplifiers, passes the input signal and converts a reflective wave into thermal energy, and an output-side amplifier which is connected to an output terminal of the balanced amplifier and amplifies an output signal.

Figure 1:
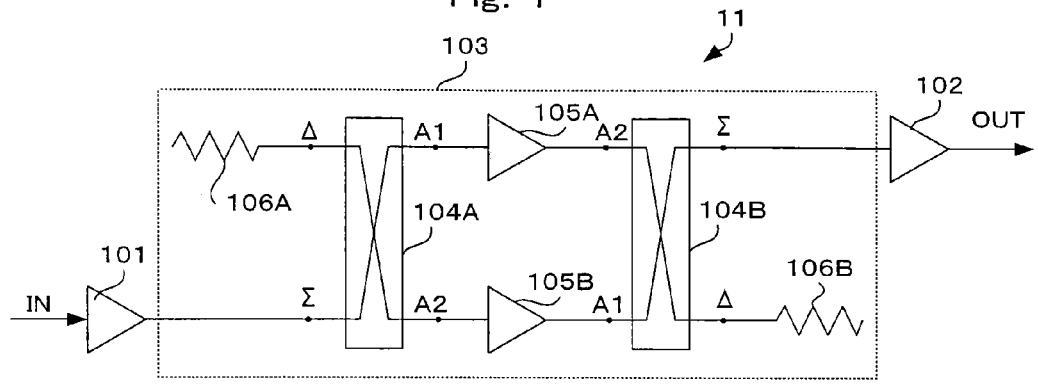
FIG. 1 is a diagram illustrating a structure of a semiconductor power amplifier.

FIG. 1 is a diagram illustrating a structure of the semiconductor power amplifier 11 according to the present embodiment. As illustrated in FIG. 1, the semiconductor power amplifier 11 comprises an input-side semiconductor amplifier 101 for inputting and amplifying an input signal, a balanced amplifier 103 connected to an output terminal of the input-side semiconductor amplifier 101, and an output-side semiconductor amplifier 102 which is connected to an output terminal of the balanced amplifier 103 and amplifies an output signal.

The input-side semiconductor amplifier 101 and the output-side semiconductor amplifier 102 may use a semiconductor amplifier such as a transistor.

An input signal to be amplified is input from an input terminal of the input-side semiconductor amplifier 101. A load (not illustrated) is connected to an output terminal of the output-side semiconductor amplifier 102.

The balanced amplifier 103 comprises a first semiconductor amplifier 105A, a second semiconductor amplifier 105B, a first hybrid coupler 104A, and a second hybrid coupler 104B.

The first hybrid coupler 104A comprises four input/output terminals, and as illustrated, the terminals are assumed as a first input/output terminal $\Delta$, a second input/output terminal $\Sigma$, a third input/output terminal A1 and a fourth input/output terminal A2. In the following, the terminal $\Delta$ will be called "difference port $\Delta$" and the terminal $\Sigma$ will be called "sum port $\Sigma$." The output terminal of the input-side semiconductor amplifier 101 is connected to the sum port $\Sigma$ of the first hybrid coupler 104A, and a termination resistor 106A is connected to the difference port $\Delta$. An input terminal of the first semiconductor amplifier 105A is connected to the output-side terminal A1, and an input terminal of the second semiconductor amplifier 105B is connected to the terminal A2.

The second hybrid coupler 104B also comprises four input/output terminals including sum port $\Sigma$, difference port $\Delta$, and terminals A1 and A2. An output terminal of the first semiconductor amplifier 105A is connected to the input-side terminal A2, and an output terminal of the second semiconductor amplifier 105B is connected to the terminal A1. An input terminal of the output-side semiconductor amplifier 102 is connected to the output-side sum port $\Sigma$, and a termination resistor 106B is connected to the difference port $\Delta$. The first hybrid coupler 104A and the second hybrid coupler 104B are different in their terminals' positions, but the structure thereof is the same as described later.

Figure 2:
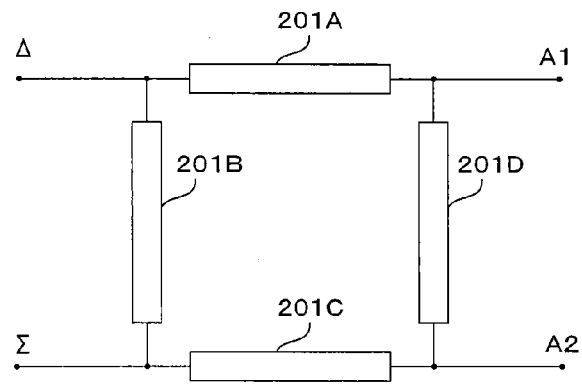
FIG. 2 is a diagram illustrating a first example of a balanced amplifier.

FIG. 2 is a circuit diagram illustrating a specific example of the hybrid coupler 104A or 104B. As illustrated in FIG. 2, for the hybrid coupler, lines having a ¼ length of a signal wavelength $\lambda$, or $\lambda/4$ lines 201A, 201B, 201C and 201D are connected between two terminals among the four input/output terminals including the difference port $\Delta$, the sum port $\Sigma$, and the terminals A1 and A2, respectively.

In the thus-configured hybrid coupler, when a signal having a wavelength $\lambda$ is input into the sum port $\Sigma$, signals delayed by phases of 90° and 180° are output to the terminals A1 and A2 at half power, respectively, and are not output to the difference port $\Delta$.

That is, the signal input from the sum port $\Sigma$ is rotated in its phase by 180° via the $\lambda/4$ line 201B and the $\lambda/4$ line 201A or via the $\lambda/4$ line 201C and the $\lambda/4$ line 201D, and is output from the terminal A1. The signal input from the sum port $\Sigma$ is rotated in its phase by 90° via the λ/4 line 201C or via the λ/4 line 201B, the λ/4 line 201A and the λ/4 line 201D, and is output from the terminal A2.

To the contrary, a sum component of the signals input from the terminal A1 and the terminal A2 is output from the sum port Σ. That is, the signal input from the terminal A1 is rotated in its phase by 90° via the λ/4 line 201A, while the signal via the λ/4 line 201C and the λ/4 line 201B from the terminal A2 is rotated in its phase by 180°. Therefore, a difference component of the signals is output from the difference port Δ.

That is, when the signals delayed by the phases of 90° and 180° at a wavelength λ are input into the terminals A1 and A2, a combination signal thereof is output to the difference port Δ, but is not output to the sum port Σ.

The balanced amplifier 103 illustrated in FIG. 1 configured by use of the hybrid couplers operates as follows.

An output signal from the input-side semiconductor amplifier 101 is rotated by 180° by the first hybrid coupler 104A to be output from the terminal A1, and is rotated by 90° to be output from the terminal A2.

The output signals are amplified by the first semiconductor amplifier 105A and the second semiconductor amplifier 105B, respectively.

The signal amplified by the first semiconductor amplifier 105A is input into the terminal A2 of the second hybrid coupler 104B and the signal amplified by the second semiconductor amplifier 105B is input into the terminal A1, respectively.

The phase of the signal to be input into the terminal A2 of the second hybrid coupler 104B is already rotated by 180° and is to be further rotated by 90°, by 270° in total, to be output from the sum port Σ.

The phase of the signal to be input into the terminal A1 of the second hybrid coupler 104B is already rotated by 90° and is to be further rotated by 180°, by 270° in total, to be output from the sum port Σ.

Then, a signal reflected on each semiconductor amplifier 105A, 105B and the output-side semiconductor amplifier 102 will be considered below. A signal wave reflected by the first semiconductor amplifier 105A and the second semiconductor amplifier 105B are converted into thermal energy by the termination resistor connected to the difference port Δ of the first hybrid coupler 104A.

A signal wave reflected in the output-side semiconductor amplifier 102 is converted into thermal energy by the termination resistor connected to the difference port Δ of the second hybrid coupler 104B.

Therefore, the reflective wave reflected by the output-side semiconductor amplifier 102 is converted into thermal energy by the balanced amplifier 103 and the amplified signal having a desired frequency can be extracted from the output-side semiconductor amplifier 102.

Figure 3:
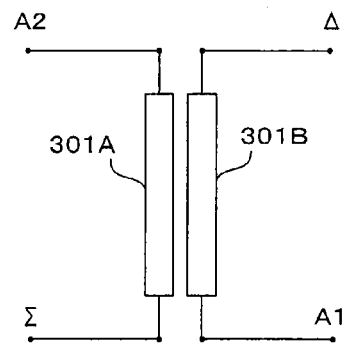
FIG. 3 is a diagram illustrating a second example of the balanced amplifier.

FIG. 3 is a diagram illustrating other specific example of the hybrid coupler 104A or 104B. As illustrated in FIG. 3, the hybrid coupler comprises two λ/4 line 301A and λ/4 line 301B separated enough to couple signals in parallel, and four input/output terminals connected to each terminal of the λ/4 line 301A and the λ/4 line 301B including difference port Δ, sum port Σ, and terminals A1 and A2.

The sum port Σ is connected to one end of the λ/4 line 301A and the terminal A2 is connected to the other end thereof. The terminal A1 is connected to one end of the sum port Σ of the λ/4 line 301B, and the difference port Δ is connected to the other end of the λ/4 line 301B.

Figure 4:
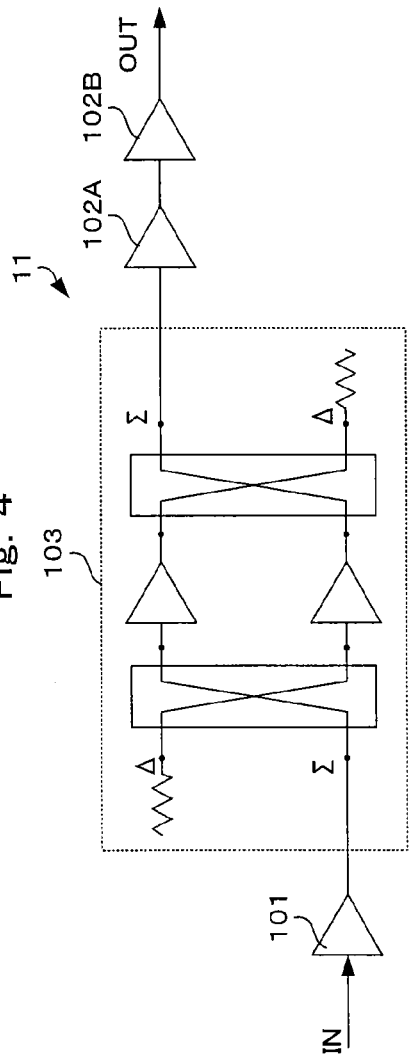
FIG. 4 is a diagram illustrating a structure of a first variant of the semiconductor power amplifier.

FIG. 4 is a diagram illustrating a structure of a first variant of the semiconductor power amplifier 11. As illustrated in FIG. 4, the semiconductor power amplifier 11 comprises the input-side semiconductor amplifier 101 for inputting and amplifying an input signal, the balanced amplifier 103 which is connected to the output terminal of the input-side semiconductor amplifier 101, passes the input signal, and converts a reflective wave into thermal energy, and the first output-side semiconductor amplifier 102A which is connected to the output terminal of the balanced amplifier 103 and amplifies an output signal, and the second output-side semiconductor amplifier 102B cascaded to the first output-side semiconductor amplifier 102A.

The output-side amplifier is configured in many stages, thereby obtaining a signal with more power.

Figure 5:
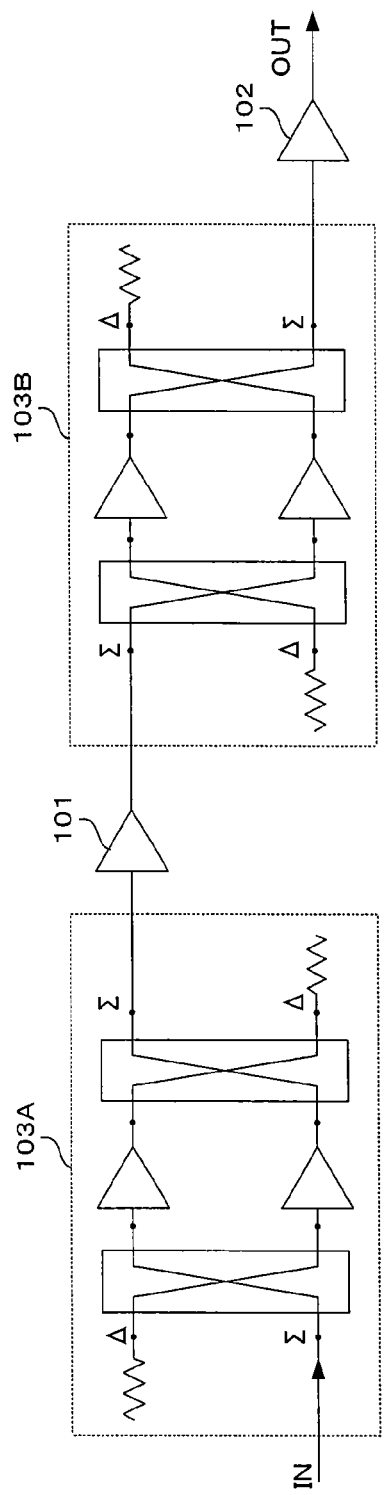
FIG. 5 is a diagram illustrating a structure of a second variant of the semiconductor power amplifier.

FIG. 5 is a diagram illustrating a structure of a second variant of the semiconductor power amplifier 11. As illustrated in FIG. 5, the semiconductor power amplifier 11 comprises a first balanced amplifier 103A which is connected to the input-side semiconductor amplifier 101 for inputting a signal from an input terminal and inputting and amplifying the input signal into the output terminal, passes the input signal, and converts a reflective wave into thermal energy, a second balanced amplifier 103B which is connected to the output terminal of the input-side semiconductor amplifier 101 and converts a reflective wave into thermal energy, and the output-side semiconductor amplifier 102 which is connected to an output terminal of the second balanced amplifier 103B and amplifies an output signal.

The balanced amplifier is provided also at the input terminal of the input-side semiconductor amplifier 101, thereby more efficiently restricting an oscillation due to reflection.

Figure 6:
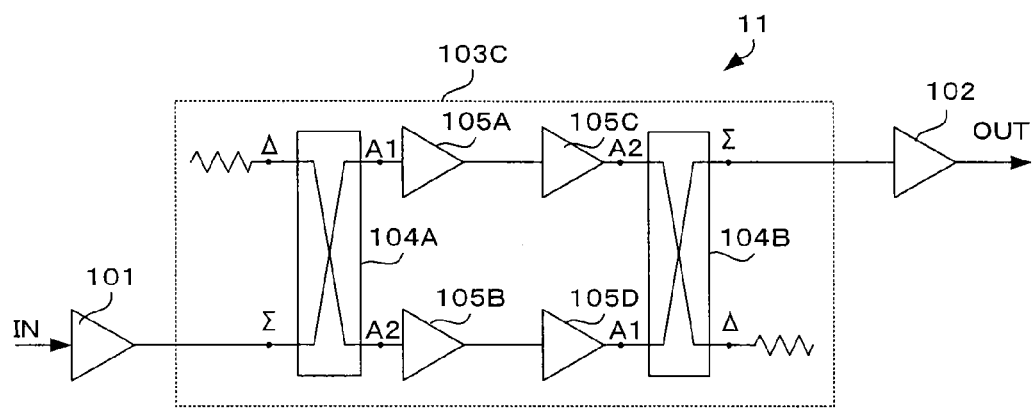
FIG. 6 is a diagram illustrating a structure of a third variant of the semiconductor power amplifier.

FIG. 6 is a diagram illustrating a structure of a third variant of the semiconductor power amplifier 11. As illustrated in FIG. 6, the semiconductor power amplifier 11 comprises the input-side semiconductor amplifier 101 for inputting and amplifying an input signal, a multi-stage balanced amplifier 103C which is connected to the output terminal of the input-side semiconductor amplifier 101, passes the input signal, and converts a reflective wave into thermal energy, and the output-side semiconductor amplifier 102 which is connected to an output terminal of the balanced amplifier 103 and amplifies an output signal.

The multi-stage balanced amplifier 103C comprises the first semiconductor amplifier 105A and the third semiconductor amplifier 105C cascaded to the first semiconductor amplifier 105A, the second semiconductor amplifier 105B and the fourth semiconductor amplifier 105D cascaded to the second semiconductor amplifier 105B, the first hybrid coupler 104A, and the second hybrid coupler 104B.

In the first hybrid coupler 104A, the output terminal of the input-side semiconductor amplifier 101 is connected to the sum port Σ, the termination resistor 106A is connected to the difference port Δ, the input terminal of the first semiconductor amplifier 105A is connected to the terminal A1, and the input terminal of the second semiconductor amplifier 105B is connected to the terminal A2.

In the second hybrid coupler 104B, the terminal A1 is connected to an output terminal of the fourth semiconductor amplifier 105D, the terminal A2 is connected to an output terminal of the third semiconductor amplifier 105C, the sum port Σ is connected to the input terminal of the output-side semiconductor amplifier 102, and the difference port Δ is connected to the termination resistor 106B.

The multi-stage balanced amplifier 103C is cascaded to the amplifiers in many stages, thereby obtaining more power while efficiently restricting an oscillation due to a reflective wave.

As described above, the semiconductor power amplifier 11 according to the present embodiment comprises the input-side semiconductor amplifier 101 for inputting and amplifying an input signal, the balanced amplifier 103 which is connected to the output terminal of the input-side semiconductor amplifier 101, comprises two hybrid couplers 104A, 104B and the semiconductor amplifiers 105A, 105B, passes the input signal, and converts a reflective wave into thermal energy, and the output-side semiconductor amplifier 102 which is connected to the output terminal of the balanced amplifier 103 and amplifies an output signal.

The balanced amplifier 103 comprises the first semiconductor amplifier 105A, the second semiconductor amplifier 105B, the first hybrid coupler 104A in which the output terminal of the input-side semiconductor amplifier 101 is connected to the sum port Σ, the termination resistor 106A is connected to the difference port Δ, the input terminal of the first semiconductor amplifier 105A is connected to the terminal A1 and the input terminal of the second semiconductor amplifier 105B is connected to the terminal A2, and the second hybrid coupler 104B in which the terminal A1 is connected to the output terminal of the second semiconductor amplifier 105B, the terminal A2 is connected to the output terminal of the first semiconductor amplifier 105A, the sum port Σ is connected to the input terminal of the output-side semiconductor amplifier 102, and the difference port Δ is connected to the termination resistor 106B.

Therefore, even under a ferromagnetic field or even if a load impedance changes, there can be obtained an effect that a reflective wave can be efficiently restricted.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and systems described herein may be made without departing from the spirit of the inventions. The accompanying claims and their equivalents are indeed to cover such forms or modifications as would fall within the scope and spirit of the inventions.

What is claimed is:

1. A semiconductor power amplifier comprising:
an input-side semiconductor amplifier for amplifying an input signal;
a balanced amplifier connected to an output terminal of the input-side amplifier; and
an output-side semiconductor amplifier connected to an output terminal of the balanced amplifier, wherein
the balanced amplifier comprises:
a first hybrid coupler which has a sum port as a first input/output terminal, a difference port as a second input/output terminal, a third input/output terminal and a fourth input/output terminal and in which the output terminal of the input-side amplifier is connected to the sum port;
a first termination resistor connected to the difference port of the first hybrid coupler;
a first semiconductor amplifier connected to the third input/output terminal of the first hybrid coupler;
a second semiconductor amplifier connected to the fourth input/output terminal of the first hybrid coupler;
a second hybrid coupler which has a sum port as a first input/output terminal, a difference port as a second input/output terminal, a third input/output terminal and a fourth input/output terminal and in which an output terminal of the first semiconductor amplifier is connected to the fourth input/output terminal, an output terminal of the second semiconductor amplifier is connected to the third input/output terminal, and an input terminal of the output-side semiconductor amplifier is connected to the sum port;
a second termination resistor connected to the difference port of the second hybrid coupler;
a first semiconductor amplifier and a third semiconductor amplifier cascaded to the first semiconductor amplifier; and
a second semiconductor amplifier and a fourth semiconductor amplifier cascaded to the second semiconductor amplifier.

* * * * *